United States Patent
Ramirez (10) Patent No.: US 11,536,754 B2
(45) Date of Patent: Dec. 27, 2022

(54) ELECTRICITY METER WITH FAULT TOLERANT POWER SUPPLY

(71) Applicant: Landis+Gyr Innovations, Inc., Alpharetta, GA (US)

(72) Inventor: Anibal Diego Ramirez, Indianapolis, IN (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 727 days.

(21) Appl. No.: 16/541,762

(22) Filed: Aug. 15, 2019

(65) Prior Publication Data
US 2021/0048462 A1    Feb. 18, 2021

(51) Int. Cl.
| | |
|---|---|
| G01R 22/06 | (2006.01) |
| G06F 1/30 | (2006.01) |
| G11C 15/04 | (2006.01) |
| H02M 7/02 | (2006.01) |
| G06F 1/3203 | (2019.01) |

(52) U.S. Cl.
CPC .............. *G01R 22/068* (2013.01); *G06F 1/30* (2013.01); *G11C 15/046* (2013.01); *H02M 7/02* (2013.01); *G01R 22/066* (2013.01); *G06F 1/3203* (2013.01)

(58) Field of Classification Search
CPC ......... G01R 22/068; G01R 27/06; G06F 1/30; G06F 1/3203; G11C 15/04; H02M 7/02
USPC ......................................................... 702/61
See application file for complete search history.

(56) References Cited

U.S. PATENT DOCUMENTS

| | | |
|---|---|---|
| 4,085,287 A | 4/1978 | Kullmann et al. |
| 4,106,095 A | 8/1978 | Yarbrough |
| 4,335,447 A | 6/1982 | Jerrim |
| 4,361,838 A | 11/1982 | Mizuta |
| 4,425,613 A | 1/1984 | Shelly |
| 4,467,434 A | 8/1984 | Hurley et al. |
| 4,504,831 A | 3/1985 | Jahr et al. |
| 4,509,128 A | 4/1985 | Coppola et al. |
| 4,575,640 A | 3/1986 | Martin |

(Continued)

FOREIGN PATENT DOCUMENTS

| | | |
|---|---|---|
| WO | 9214300 | 8/1992 |
| WO | 2012062367 | 5/2012 |

(Continued)

OTHER PUBLICATIONS

U.S. Appl. No. 10/661,114, Notice of Allowance dated Oct. 3, 2005, 4 pages.

(Continued)

*Primary Examiner* — Hal Kaplan
(74) *Attorney, Agent, or Firm* — Kilpatrick Townsend & Stockton LLP (57) ABSTRACT

Techniques for implementing a fault-tolerant power supply are described. In an example, a system converts an alternating-current (AC) voltage to an initial direct current (DC) voltage. The system further converts the initial DC voltage to a first DC voltage and a second DC voltage. The system applies the first DC voltage to a high-priority device such as a metrology device. The system applies the second DC voltage to a low-priority or peripheral device. When the initial DC voltage is outside a voltage range, the system deactivates the second DC voltage to the lower-priority device and maintains the first DC voltage to the metrology device.

20 Claims, 6 Drawing Sheets

(56) References Cited

U.S. PATENT DOCUMENTS

| | | |
|---|---|---|
| 4,594,545 A | 6/1986 | Germer |
| 4,631,476 A | 12/1986 | Germer et al. |
| 4,646,084 A | 2/1987 | Burrowes et al. |
| 4,662,736 A | 5/1987 | Taniguchi et al. |
| 4,701,858 A | 10/1987 | Stokes et al. |
| 4,707,679 A | 11/1987 | Kennon et al. |
| 4,707,852 A | 11/1987 | Jahr et al. |
| 4,758,836 A | 7/1988 | Scuilli |
| 4,845,607 A | 7/1989 | Nakao et al. |
| 4,881,070 A | 11/1989 | Burrowes et al. |
| 4,987,363 A | 1/1991 | Gibbs et al. |
| 4,999,575 A | 3/1991 | Germer et al. |
| 5,070,481 A | 12/1991 | Haubner et al. |
| 5,111,407 A | 5/1992 | Galpern |
| 5,181,026 A | 1/1993 | Granville |
| 5,216,357 A | 6/1993 | Coppola et al. |
| 5,345,231 A | 9/1994 | Koo et al. |
| 5,414,861 A | 5/1995 | Horning |
| 5,471,137 A | 11/1995 | Briese et al. |
| 5,488,565 A | 1/1996 | Kennon et al. |
| 5,523,751 A | 6/1996 | Byford et al. |
| 5,544,089 A | 8/1996 | Hemminger et al. |
| 5,619,192 A | 4/1997 | Ayala |
| 5,627,462 A | 5/1997 | Whitehead, Jr. |
| 5,650,669 A | 7/1997 | Aldous |
| 5,680,294 A | 10/1997 | Stora et al. |
| 5,809,311 A | 9/1998 | Jones |
| 5,923,099 A | 7/1999 | Bilir |
| 5,924,051 A | 7/1999 | Provost et al. |
| 5,940,009 A | 8/1999 | Loy et al. |
| 5,942,811 A | 8/1999 | Stumfall et al. |
| 6,112,158 A | 8/2000 | Bond et al. |
| 6,115,676 A | 9/2000 | Rector et al. |
| 6,476,519 B1 | 11/2002 | Weiner |
| 6,559,631 B1 | 5/2003 | Balch et al. |
| 6,615,147 B1 | 9/2003 | Jonker et al. |
| 6,816,360 B2 | 11/2004 | Brooksby et al. |
| 6,885,185 B1 | 4/2005 | Makinson et al. |
| 6,957,158 B1 | 10/2005 | Hancock et al. |
| 7,009,379 B2 | 3/2006 | Ramirez |
| 7,077,317 B2 | 7/2006 | Longacre, Jr. et al. |
| 7,088,239 B2 | 8/2006 | Basinger et al. |
| 7,124,948 B2 | 10/2006 | Longacre, Jr. et al. |
| 7,135,850 B2 | 11/2006 | Ramirez |
| 7,209,840 B2 | 4/2007 | Petite et al. |
| 7,239,250 B2 | 7/2007 | Brian et al. |
| 7,263,073 B2 | 8/2007 | Petite et al. |
| 7,348,769 B2 | 3/2008 | Ramirez |
| 7,385,524 B1 | 6/2008 | Orlosky |
| 7,469,190 B2 | 12/2008 | Bickel |
| 7,498,953 B2 | 3/2009 | Salser, Jr. et al. |
| 7,693,670 B2 | 4/2010 | Durling et al. |
| 7,847,690 B2 | 12/2010 | Murphy |
| 7,990,806 B2 | 8/2011 | Chen |
| 8,004,933 B2 | 8/2011 | Iseli |
| 8,121,741 B2 | 2/2012 | Taft et al. |
| 8,223,466 B2 | 7/2012 | Roscoe |
| 8,322,215 B2 | 12/2012 | Lakich et al. |
| 8,326,554 B2 | 12/2012 | Caird |
| 8,635,036 B2 | 1/2014 | Pamulaparthy et al. |
| 8,754,634 B2 | 6/2014 | Chamarti et al. |
| 8,830,083 B2 | 9/2014 | LaFrance et al. |
| 8,854,217 B2 | 10/2014 | Brown et al. |
| 8,947,246 B2 | 2/2015 | Aiken |
| 8,978,443 B2 | 3/2015 | Ramirez |
| 8,996,144 B2 | 3/2015 | LaFrance et al. |
| 9,099,955 B2 | 8/2015 | Ramirez |
| 9,110,108 B2 * | 8/2015 | Ramirez ............... G01R 22/10 |
| 9,146,135 B2 | 9/2015 | Ramirez |
| 9,164,135 B2 | 10/2015 | Cs et al. |
| 9,304,014 B2 | 4/2016 | Komati et al. |
| 9,341,686 B2 | 5/2016 | Deak et al. |
| 9,476,740 B2 | 10/2016 | Zigovszki et al. |
| 9,557,392 B2 | 1/2017 | Schuhl et al. |
| 9,602,895 B2 | 3/2017 | Bowling et al. |
| 9,671,254 B2 | 6/2017 | Zigovszki et al. |
| 9,887,051 B2 | 2/2018 | LaFrance et al. |
| 9,891,088 B2 | 2/2018 | Zigovszki et al. |
| 10,036,768 B2 | 7/2018 | Ramirez |
| 10,240,961 B2 | 3/2019 | Cheng et al. |
| 10,254,315 B2 | 4/2019 | Higashi et al. |
| 10,295,578 B2 | 5/2019 | Higashi et al. |
| 2003/0002233 A1 | 1/2003 | Usui |
| 2003/0111911 A1 | 6/2003 | Hsu |
| 2004/0128085 A1 | 7/2004 | Ramirez |
| 2005/0017702 A1 | 1/2005 | Kernahan et al. |
| 2006/0091877 A1 | 5/2006 | Robinson et al. |
| 2006/0158177 A1 | 7/2006 | Ramirez |
| 2007/0016340 A1 | 1/2007 | Soudier et al. |
| 2008/0036447 A1 | 2/2008 | Slater et al. |
| 2008/0074259 A1 | 3/2008 | Houston |
| 2009/0015234 A1 | 1/2009 | Voisine et al. |
| 2009/0016549 A1 | 1/2009 | French et al. |
| 2009/0055031 A1 | 2/2009 | Slota et al. |
| 2009/0289501 A1 | 11/2009 | Garb |
| 2010/0020135 A1 | 1/2010 | Morozumi et al. |
| 2010/0052655 A1 | 3/2010 | King et al. |
| 2010/0315263 A1 | 12/2010 | Shuey |
| 2010/0321883 A1 | 12/2010 | Tracy et al. |
| 2011/0006748 A1 | 1/2011 | Jang et al. |
| 2011/0110000 A1 | 5/2011 | Etter |
| 2011/0128153 A1 | 6/2011 | Sims et al. |
| 2011/0163695 A1 | 7/2011 | Schmid et al. |
| 2012/0096373 A1 | 4/2012 | Aguera y Arcas et al. |
| 2012/0146529 A1 | 6/2012 | Campbell et al. |
| 2012/0169311 A1 | 7/2012 | Malmberg et al. |
| 2012/0194955 A1 | 8/2012 | Billingsley et al. |
| 2013/0003422 A1 | 1/2013 | Persson et al. |
| 2013/0018843 A1 | 1/2013 | Bultman et al. |
| 2013/0077359 A1 | 3/2013 | Lindemann et al. |
| 2013/0293219 A1 | 11/2013 | Ramirez et al. |
| 2015/0021996 A1 | 1/2015 | Augesky |
| 2018/0073910 A1 | 3/2018 | Deak et al. |
| 2018/0106640 A1 | 4/2018 | Padrones et al. |
| 2019/0094329 A1 | 3/2019 | Minich |
| 2019/0101411 A1 | 4/2019 | Davis et al. |
| 2019/0219618 A1 | 7/2019 | Davis et al. |

FOREIGN PATENT DOCUMENTS

| | | |
|---|---|---|
| WO | 2018071904 | 4/2018 |
| WO | 2018072030 | 4/2018 |
| WO | 2018083902 | 5/2018 |
| WO | 2019026791 | 2/2019 |
| WO | 2019027706 | 2/2019 |
| WO | 2019067638 | 4/2019 |

OTHER PUBLICATIONS

U.S. Appl. No. 10/661,114, Ex-Parte Quayle Action mailed on Jul. 14, 2005, 4 pages.
U.S. Appl. No. 11/353,738, Notice of Allowance dated Aug. 14, 2006, 7 pages.
U.S. Appl. No. 11/365,133, Notice of Allowance dated Oct. 29, 2007, 7 pages.
U.S. Appl. No. 13/219,947, Final Office Action dated Sep. 2, 2014, 13 pages.
U.S. Appl. No. 13/219,947, Final Office Action dated Jun. 29, 2016, 27 pages.
U.S. Appl. No. 13/219,947, Final Office Action dated Nov. 19, 2015, 28 pages.
U.S. Appl. No. 13/219,947, Non-Final Office Action dated Mar. 25, 2015, 21 pages.
U.S. Appl. No. 13/219,947, Non-Final Office Action dated Oct. 28, 2013, 20 pages.
U.S. Appl. No. 13/219,947, Non-Final Office Action dated Feb. 20, 2014, 22 pages.
U.S. Appl. No. 13/219,947, Non-Final Office Action dated Feb. 4, 2016, 25 pages.
U.S. Appl. No. 13/219,947, Non-Final Office Action dated Jun. 6, 2017, 33 pages.

(56) References Cited

OTHER PUBLICATIONS

U.S. Appl. No. 13/219,947, Non-Final Office Action dated Oct. 25, 2017, 34 pages.
U.S. Appl. No. 13/219,947, Notice of Allowance dated Mar. 22, 2018, 11 pages.
U.S. Appl. No. 13/464,374, Final Office Action dated Nov. 25, 2014, 22 pages.
U.S. Appl. No. 13/464,374, Non-Final Office Action dated May 23, 2014, 19 pages.
U.S. Appl. No. 13/464,374, Notice of Allowance dated Apr. 3, 2015, 11 pages.
U.S. Appl. No. 13/538,159, Notice of Allowance dated Mar. 30, 2015, 9 pages.
U.S. Appl. No. 13/631,431, Non-Final Office Action dated Nov. 10, 2014, 17 pages.
U.S. Appl. No. 13/631,431, Notice of Allowance dated Mar. 26, 2015, 6 pages.
Power: Telecom/Server AC/DC Supply: Single Controller: Analog, Block Diagram (SBD). Texas Instruments, Mar. 5, 2010, 3 pages.
PCT Patent Application No. PCT/US2020/044722, International Search Report and Written Opinion, dated Oct. 8, 2020, 13 pages.

\* cited by examiner

ELECTRICITY METER WITH FAULT TOLERANT POWER SUPPLY

TECHNICAL FIELD

This disclosure relates generally to electricity meters and more specifically to electrical meters with fault tolerant internal power supplies.

BACKGROUND

Electricity meters, typically located at an end user premises, measure power consumed by electrical loads like air conditioners, televisions, lights, and so on. Some electric meters include additional hardware that can function above and beyond metering, such as transmitting consumption information over a wireless network, performing analysis of power consumption, or detecting meter tampering. To power this additional hardware, electricity meters include an internal power supply that delivers power to both the traditional metrology systems and these additional devices.

But the additional hardware in newer meters, e.g., processors, communications devices, network cards, etc., requires additional electrical power relative to normal requirements, increasing a risk of power faults such as short-circuiting or over-consumption and causing additional heat to be generated. In existing solutions, upon detecting an electrical fault, the metering functionality is also turned off. Because power is still being delivered to an end user premises, no measurement of power consumption takes place for a period of time and billing information is lost. Hence, new solutions are needed.

SUMMARY

Certain aspects and features relate to technical improvements for fault-tolerant power supplies for electric meters. In an example, a system converts an alternating-current (AC) voltage to an initial direct current (DC) voltage. The system further converts the initial DC voltage to a first DC voltage and a second DC voltage. The system applies the first DC voltage to a high-priority device such as a metrology device. The system applies the second DC voltage to a low-priority or peripheral device. When the initial DC voltage is outside a voltage range, the system deactivates the second DC voltage to the lower-priority device and maintains the first DC voltage to the metrology device.

These illustrative examples are mentioned not to limit or define the disclosure, but to provide examples to aid understanding thereof. Additional examples and further description are provided in the Detailed Description.

BRIEF DESCRIPTION OF THE FIGURES

These and other features, aspects, and advantages of the present disclosure are better understood when the following Detailed Description is read with reference to the accompanying drawings, where.

DETAILED DESCRIPTION

Aspects of the present disclosure relate to fault-tolerant internal power supplies for electric metering systems. In addition to core metrology hardware, electric metering systems can include peripherals such as host-meter communications devices, wireless networking cards, and the like. Generally, these peripherals are considered to be secondary to metrology functions, which remain active for billing purposes. Disclosed solutions provide a fault-tolerant power supply that can detect and recover from a fault such as a short circuit or an over-current situation caused by a peripheral or an external device connected to the meter, while maintaining power to the metrology hardware.

In some aspects, disclosed systems include a processor (e.g., a host processor) that receives an indication of one or more voltages that are provided to the metrology systems and peripherals. Based on these voltages, the processor can make a determination that a power fault has occurred. Examples of faults include a hardware device failure, a short-circuit, or an over current. In response, the processor causes the power supply to deactivate the output to the peripheral while leaving the power supply to the metrology unit connected.

Figure 1:
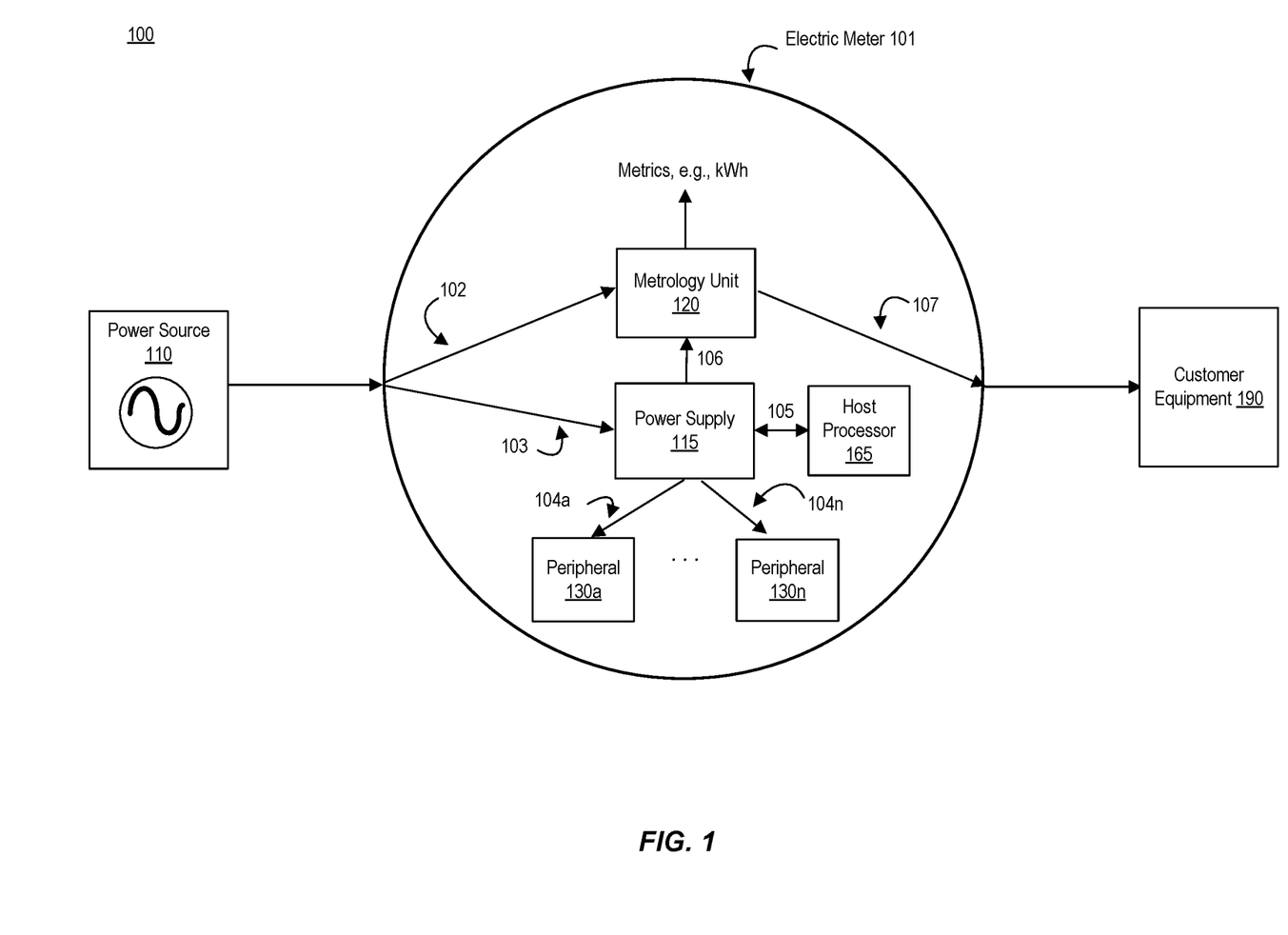
FIG. 1 illustrates an example of a metering environment that includes an electric meter with a fault-tolerant power supply, in accordance with an aspect of the present disclosure.

Turning now to the Figures, FIG. 1 illustrates an example of a metering environment that includes an electric meter with a fault-tolerant power supply, in accordance with an aspect of the present disclosure. Metering environment 100 includes electric meter 101, power source 110 and customer equipment 190. Power source 110 provides electric power to both electric meter 101, e.g., to power internal equipment of electric meter 101, and via electric meter 101 to customer equipment 190. Examples of power source 110 are distribution lines and substations. Typical voltages provided by power source 110 are 108 Volts (V), 120 V, 240 V, and so on. Power source 110 can be single or multi-phase. Examples of customer equipment 190 include lamps, motors, household appliances, and industrial equipment.

Electric meter 101 includes one or more of power supply 115, processor 165, metrology unit 120, and peripherals 130a-n. More specifically, electric meter 101 receives power from power source 110 and provides the power via connection 102 to the metrology unit 120 and via connection 103 to the power supply 115. In a multi-phase environment, connection 102 and connection 103 include one or more phases of alternating current. Metrology unit 120 receives power via connection 102, provides power via connection 107 to customer equipment 190, and measures current consumption on each phase of connection 102. Metrology unit 120 can perform additional functions such as measuring voltage, detecting zero-crossings, and advanced analytics such as detecting peak or low demand times.

Power supply 115 provides power to both metrology unit 120 and to peripherals 130a-n. Examples of peripherals 130a-n are communications devices, Peripheral Component Interconnect (PCI) express cards, Universal Serial Bus (USB) controllers, etc. In particular, power supply 115 can provide separate power outputs to different devices. Connection 106 to metrology unit 120 can be separately switched from connections 104a-n, which provide power to peripherals 130a-n via connections 104a-n respectively. For example, power supply 115 can include a transformer that steps down the incoming voltage from power source 110 to a suitable level (e.g., 12 V or 24 V). Power supply 115 can also include additional converters such as rectifiers that convert AC to DC and other (e.g., transistor-based) switching devices that convert a first, or initial, DC voltage (e.g., 12 V) to a second, lower voltage (e.g., 3.3 V or 5 V).

Power supply 115 operates in conjunction with processor 165 to detect faults such as over-voltages, overheating, and electric noise. In response, power supply 115 can take action such as shutting down one or more peripherals for a period of time or on a permanent basis. Examples of processor 165 include microcontrollers, signal processors, and general-purpose processors. Power supply 115 connects to processor 165 via connection 105. A state of one or more voltages generated by power supply 115 is provided to processor 165 over connection 105. Additionally, connection 105 enables processor 165 to separately control power to the metrology unit 220 and peripherals 130a-n on a granular basis. For example, processor 165 can selectively deactivate or reactivate peripherals 130a-n as appropriate.

Figure 2:
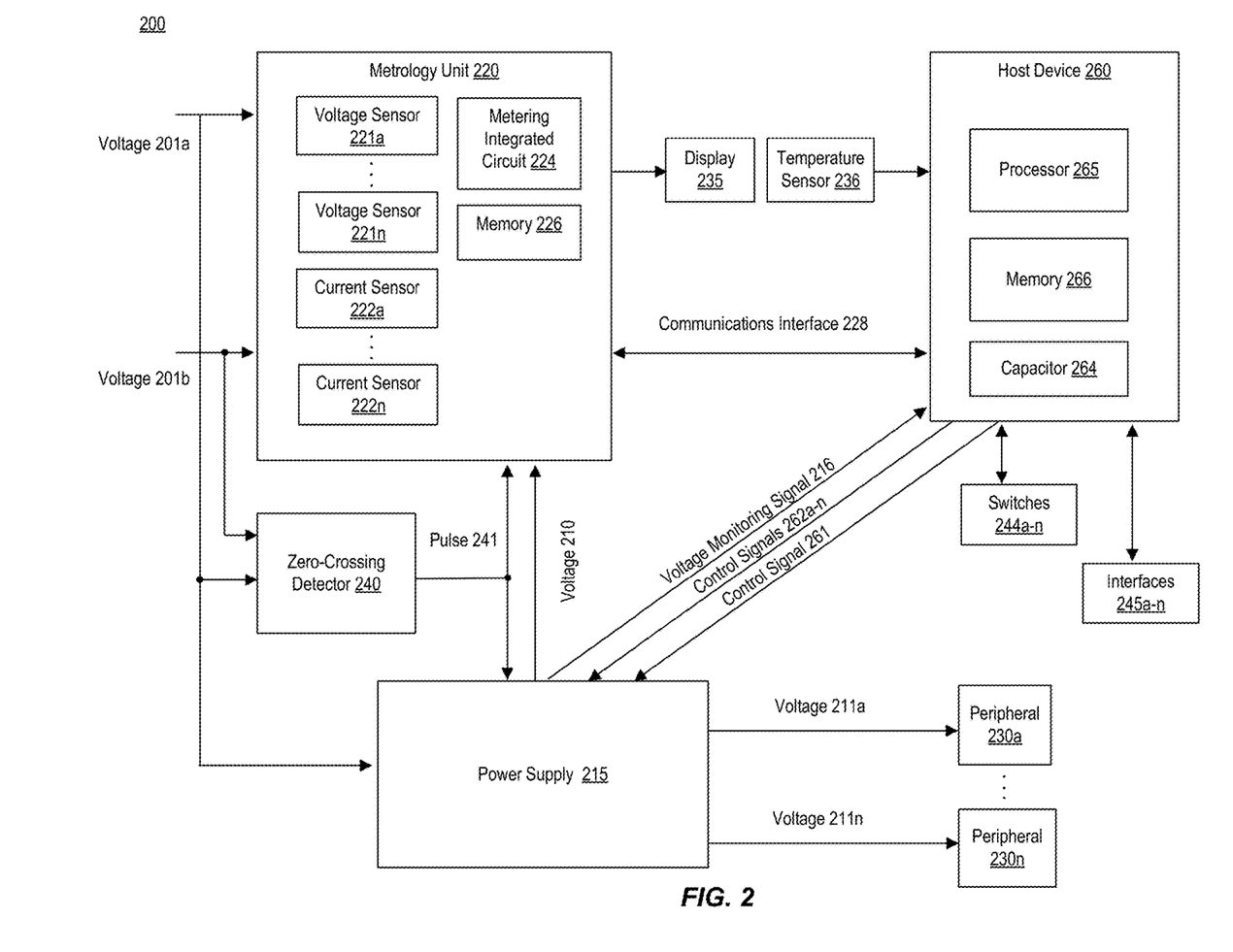
FIG. 2 is a schematic diagram of an electric meter system, in accordance with an aspect of the present disclosure.

FIG. 2 is a schematic diagram of an electric meter system, in accordance with an aspect of the present disclosure. Electric meter system 200, which is an example of electric meter 101, includes one or more of power supply 215, metrology unit 220, display 235, zero-crossing detector 240, peripherals 230a-n, switches 244a-n, interface 245a-n, and host device 260.

Metrology unit 220 receives power for measurement. As depicted, metrology unit 220 receives voltage 201a at a first phase and voltage 201b at a second phase, but metrology unit 220 can operate with any number of phases. Metrology unit 220 includes voltage sensors 221a-b, which detect voltages on specific phases, and current sensors 222a-n, which detect current consumed on specific phases. Voltage sensors 221a-b can sample the voltages 201a-b and current sensors and computes active energy, reactive energy, power outages and other related service information.

Metrology unit 220 also includes a metering integrated circuit (IC) 224, which can include hardware that operates in the digital or analog domain. Memory 226, which can be non-volatile, is used to store metering information, for example, before the metering information is provided to the host device 260 for transmission to another device or for extraction by a utility meter reader.

Zero-crossing detector 240 monitors voltages 201a-b, each of which represents a different phase (but any number of phases are possible). Zero-crossing detector 240 outputs a pulse 241 every time an AC voltage passes the zero-threshold. Pulse 241 is used by metrology unit for metering purposes and is also used by power supply 215 to provide an early indication that AC power is lost to the meter. Zero-crossing detector 240 can also provide single versus polyphase detection. In some cases, this functionality is integrated into metrology unit 220, e.g., in metering IC 224.

Power supply 215 receives power and provides power to internal devices. For example, power supply 215 provides power output to metrology unit via voltage 210 and to peripherals 230a-n via voltages 211a-n respectively. Power supply 215 sends voltage monitoring signal 216, which includes information about both pulse 241 and the voltages 211a-n, to host device 260. In turn, host device 260 can determine a presence of a fault and can issue controls via control signals 262a-n to the power supply. Examples of controls include disabling power to one or more voltages 211a-n in the event of a fault. The power supply is discussed further with respect to FIGS. 3-4.

Host device 260 can control power supply 215 via one or more control signals. For example, host device 260 sends control signals 261 and control signals 262a-n to power supply 215. Based on control signal 261, power supply 215 can activate or deactivate power to the metrology unit 220, e.g., by controlling the output voltage 210. Based on control signals 262a-n, power supply 215 can activate or deactivate power to one or more peripherals 230a-n, e.g., by controlling voltages 211a-n. Examples of processes performed by host device 260, e.g., processor 265, are described further with respect to FIGS. 4-5.

Host device 260 connects to metrology unit 220 via communications interface 228. Host device 260 can receive metering and billing information across communications interface 228. Host device 260 can also control metrology unit 220 via communications interface 228, for example, by issuing a command to stop metering, shut off the power to the end user premises, or perform other functions. The host device 260 processes metering information and other information such as tampering events using processor 265 and stores the information in memory 266. Host device 260 connects to switches 244a-n. Switches 244a-n can be externally located on the meter or accessible by a user by removing a cover. Switches 244a-n provide some control, configuration, or customization of settings, for example a demand reset. In some cases, electric meter system can include a magnetically-activated switch that permits a user to read service-related information (e.g., line voltages, currents, and/or phase angles) on a display. In some cases, host device 260 connects to interfaces 245a-n, which provides connection with external devices such as computers and monitoring devices. Examples of interfaces 245a-n are Universal Serial Bus (USB) and a serial interface. In some cases, the metrology unit 220 and the host device 260 are integrated on to a single integrated circuit. An example of a host device is discussed further with respect to FIG. 6.

In some aspects, electric meter system 200 can include temperature sensor 236. Temperature sensor 236 can be located internally to electric meter system 200 and/or form part of the electronics assembly. Temperature sensor 236 interfaces with host device 260 to provide a current temperature of electronics within electric meter system 200.

For example, processor 265 can continuously monitor a temperature inside electric meter system 200. If the temperature is outside of a safe operating temperature range, processor 265 can cause power supply 315 to shut down one or more peripherals 230a-n, while preserving power to metrology unit 220. Processor 265 can continue to monitor the temperature and when electric meter system 200 returns to a safe operating temperature range, processor 265 can cause one or more peripherals 230a-n to turn back on. In some cases, a safe operating temperature range is below approximately +80 Celsius to +85 Celsius.

Figure 3:
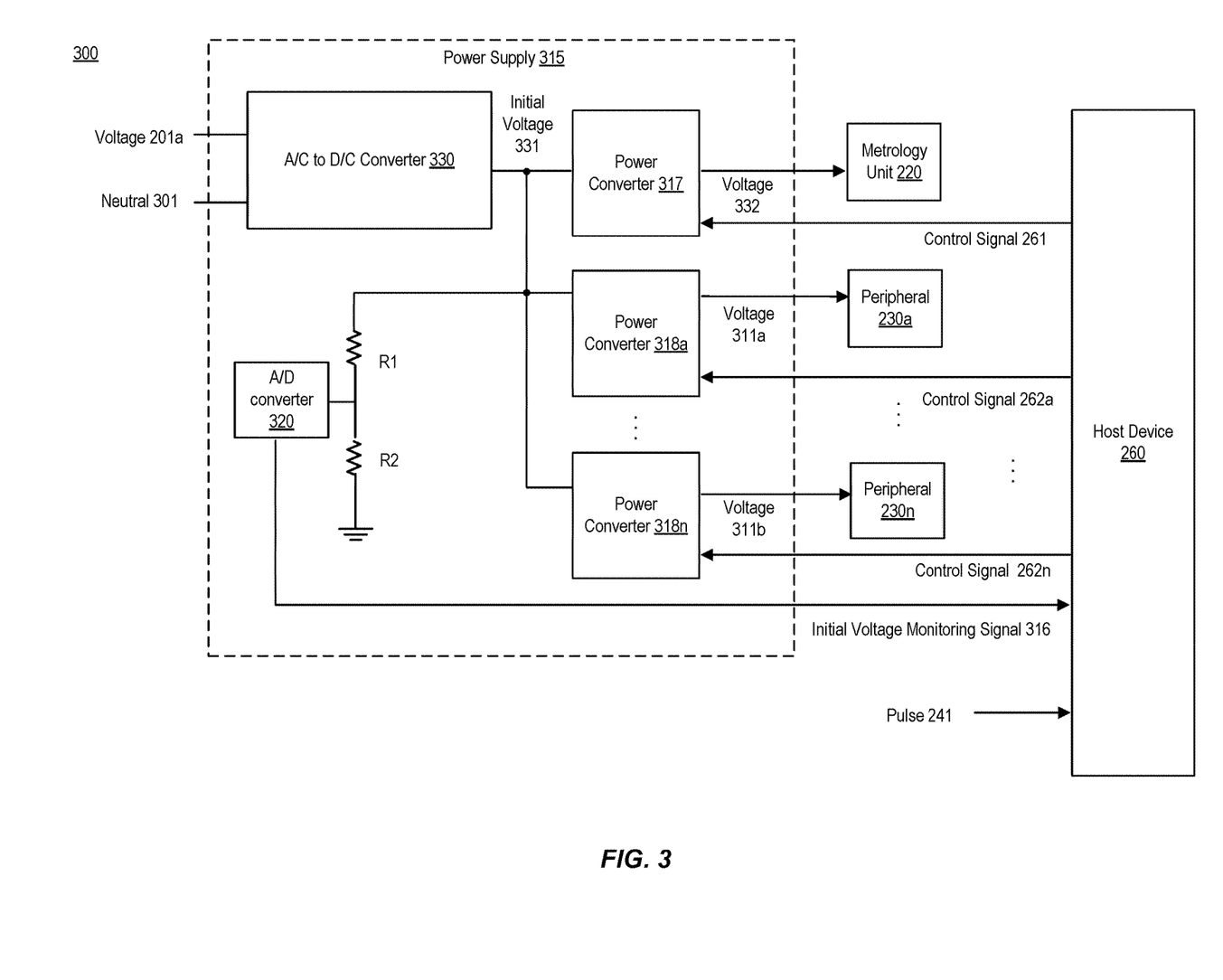
FIG. 3 is a schematic diagram of an electric meter system, in accordance with an aspect of the present disclosure.

FIG. 3 illustrates an additional schematic diagram of an electric metering system, in accordance with an aspect of the present disclosure. FIG. 3 depicts fault tolerant power supply system 300, which includes metrology unit 220, power supply 315, host device 260, and peripherals 230a-n. Power supply 315 includes AC to DC converter 330, which receives voltage 201a and neutral 301 and steps down the input AC voltage to initial voltage 331. In an example, the initial voltage 331 is 12 V, but the initial voltage can be any voltage. An initial voltage is a voltage that can then be further reduced to meet the needs of specific equipment.

Specific voltages may be required depending on the type of peripheral. For example, PCI Express can require 3.3 V, a wireless card can require 3.3 V, and a radio can require 4 V. Power converter 317 converts initial voltage 331 into voltage 332 (an example of which is 3.3 V) and provides voltage 332 to metrology unit 220. Each of power converters 318a-n can convert the initial voltage 331 to different voltages. For example, power converter 318a can convert initial voltage 331 to 3.3 V and power converter 318b can convert initial voltage 331 to 5 V. Voltages 311a-n are provided to peripherals 230a-n respectively. Examples of voltages 311a-n are 3.3 V and 5 V. In some cases, even though two peripherals 230a-n may require the same voltage, different power converters 318a-n can be used, giving power supply 315 the ability to turn on and off different peripherals on an individualized basis.

Figure 4:
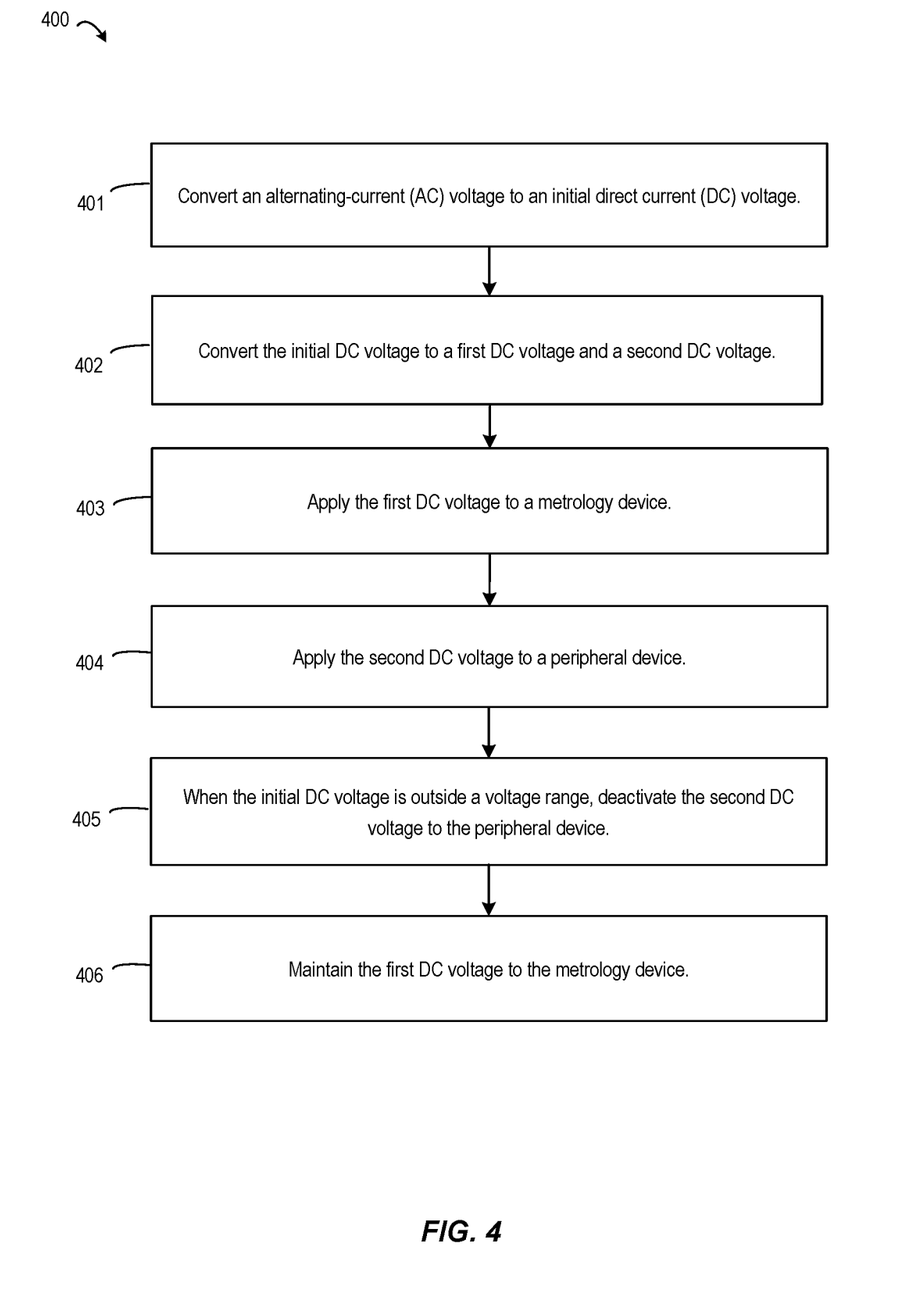
FIG. 4 is a flowchart illustrating an exemplary process for detecting a fault of a peripheral device, in accordance with an aspect of the present disclosure.

Power supply 315 provides, via A/C to D/C converter 330, an initial voltage 331 to resistors R1 and R2. For example, considering an initial voltage of +12 Volts DC, R1=82 kohms and R2=12 kohms. In this case, the range of voltage going to A/D converter 320 is approximately 1.53 VDC. Analog to Digital (A/D) converter 320 is connected between resistors R1 and R2, which can operate as a voltage divider. A/D converter 320 periodically samples the voltage measured between R1 and R2, providing a digital voltage monitoring signal 316 to host device 260. Host device 260 receives initial voltage monitoring signal 316 and pulse 241 from zero-crossing detector 240. Using initial voltage monitoring signal 316 and pulse 241, host device 260 implements fault-tolerant power management. The host device 260 uses these signals to form an early detection of an overcurrent fault or other error and to take corrective actions to maintain the metering functionality of the meter. FIG. 4 explains an example of a process.

As discussed, one or more peripherals 230a-n can cause an over-current, short-circuit, or other failure. For example, if the AC line voltage is above a minimum line voltage threshold (e.g., 120 V), but the initial voltage 331 remains below a threshold, then either excessive consumption or a short circuit on the part of one or more peripherals 230a-n is causing the low voltage. FIG. 4 describes an example of a process for identifying a failure.

FIG. 4 is a flowchart illustrating an exemplary process 400 for detecting a fault of a peripheral device, in accordance with an aspect of the present disclosure. Process 400 can be implemented by processor 265 on host device 260 or by another processor.

At block 401, process 400 involves converting an alternating-current (AC) voltage to an initial direct current (DC) voltage. For example, AC to DC converter 330 converts voltage 201a (AC) to initial voltage 331 (e.g., 12 V).

At block 402, process 400 involves converting the initial DC voltage to a first DC voltage and a second DC voltage. For example, power converter 317 converts initial voltage 331 to voltage 332 and power converter 318a converts initial voltage 331 to voltage 311a.

At block 403, process 400 involves applying the first DC voltage to a metrology device. For example, host device 260 causes power converter 317 to provide voltage 332 to metrology unit 220.

At block 404, process 400 involves applying the second DC voltage to a peripheral device. For example, host device 260 causes power converter 318a to provide voltage 311a to peripheral 230a.

At block 405, process 400 involves detecting that the initial DC voltage is outside a voltage range and deactivating the second DC voltage to the peripheral device. For example, host device 260 analyzes initial voltage monitoring signal 316. Upon detecting that initial voltage monitoring signal 316 is outside, e.g., below, a range, host device 260 causes power converter 318a to deactivate voltage 311a to peripheral 230a by issuing a control signal 262a. In some cases, host device 260 can check pulse 241 to determine whether the meter has AC power before deactivating any peripherals.

At block 406, process 400 involves maintaining the first DC voltage to the metrology device. Host device 260 maintains voltage 332 to metrology unit 220.

Upon detecting a fault, host device 260 can take one or more actions. For example, host device 260 can attempt to recover from the fault, send an alert, or disable one or more peripherals. In one example, after a threshold amount of time is met, host device 260 sends control signals 262a-n to power converters 318a-n, causing power to be provided back to all peripherals 230a-n. Different processes can be used, such as process 500 discussed with respect to FIG. 5.

Figure 5:
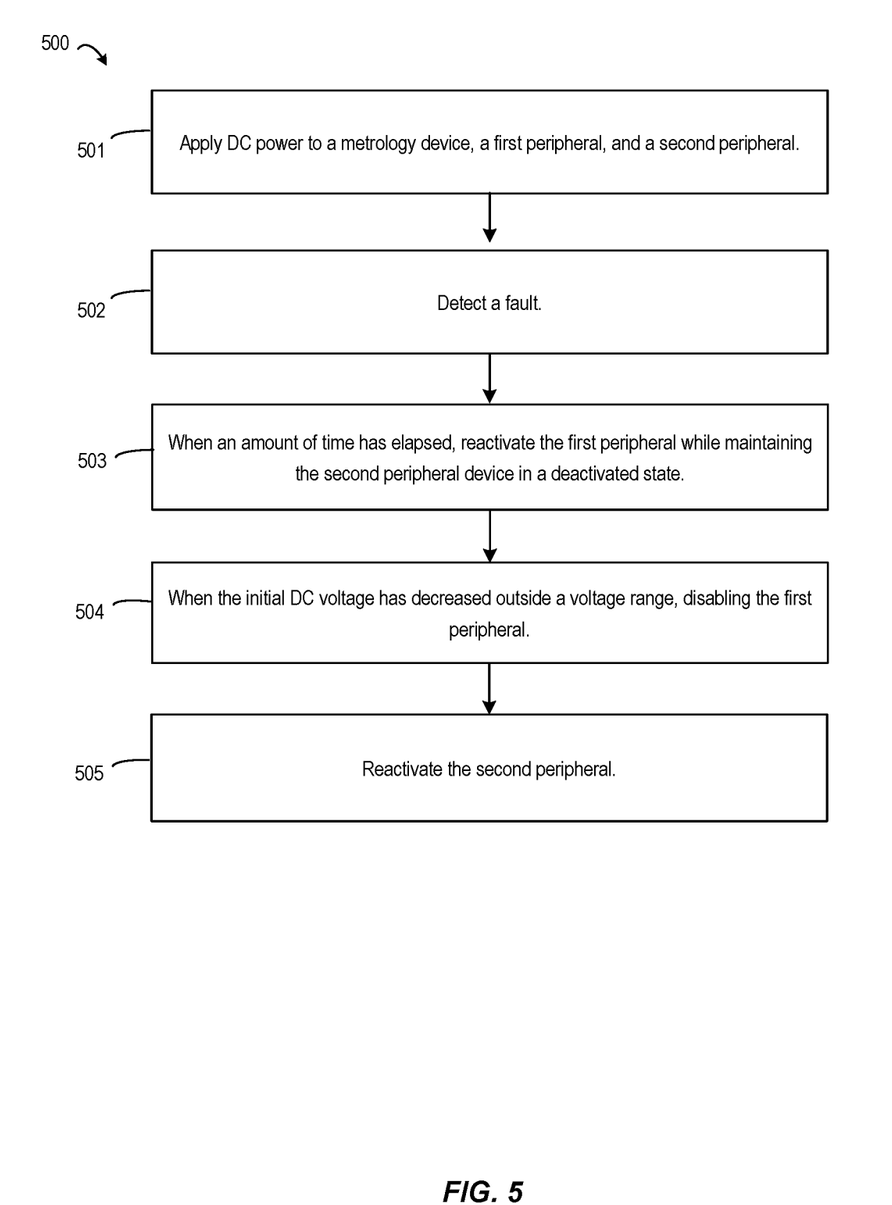
FIG. 5 is a flowchart illustrating an exemplary process for recovering from a detected fault of a peripheral device, in accordance with an aspect of the present disclosure.

FIG. 5 is a flowchart illustrating an exemplary process for recovering from a detected fault of a peripheral device, in accordance with an aspect of the present disclosure. Process 500 can be implemented by processor 265 on host device 260 or by another processor.

At block 501, process 500 involves applying DC power to a metrology device, a first peripheral, and a second peripheral. At block 501, process 500 involves substantially similar operations as described with respect to blocks 401-404 of process 400. For example, host device 260 causes power converter 317 to provide power to metrology unit 220, power converter 318a to provide power to peripheral 230a and power converter 318n to provide power to peripheral 230n.

At block 502, process 500 involves detecting a fault. At block 502, process 500 involves substantially similar operations as described with respect to block 405 of process 400. For example, host device 260 detects that initial voltage monitoring signal 316 is outside a range. An example of a range is 10 V-12 V for an expected 12 V initial voltage. Host device 260 causes power converter 317 to maintain power to metrology unit 220.

At block 503, process 500 involves determining that an amount of time has elapsed and reactivating the first peripheral while maintaining the second peripheral device in a deactivated state. Host device 260 waits for some time to allow the fault to potentially correct itself before reactivating power. Host device 260 then issues a control signal 262a to cause power converter 318a to reactivate voltage 311a to peripheral 230a. Host device 260 causes power converter 318n to maintain peripheral 230n in a deactivated state.

At block 504, process 500 involves determining that the initial DC voltage has decreased outside a voltage range, disabling the first peripheral. Host device 260 receives initial voltage monitoring signal 316 and determines that initial voltage monitoring signal 316 is outside a range for the second time. Host device 260 disables peripheral 230a after this second fault is detected. In other cases, host device 260 can try three or more times to bring a peripheral back online before disabling that peripheral. In some cases, host device 260 can store the fault as permanent and disable the power supply to peripheral 230a until the meter can be serviced.

At block 505, process 500 involves reactivating the second peripheral. For example, host device 260 issues control signal 262n to reactivate voltage 311b to peripheral 230n.

In some cases, different peripherals 230a-n can have different priorities. For example, a WiFi device might have a higher priority than a radio. In that case, after a failure, host device 260 attempts to reactive the WiFi device before attempting to reactivate the radio.

Various actions can be taken by host device 260 following a failure or at any point in the recovery process. For example, host device 260 can send a message to an external device or log the fault or the recovery in non-volatile memory. For example, after successfully reactivating both devices, if an overcurrent does not reappear after enabling all of the power converters 318a-n, that event can be logged. In other cases, processor can log a time and origin (e.g., which peripheral) of a malfunction and then communicate this information to an external entity such as a utility company.

Further, host device 260 can also detect whether there is a fault on power supply to the meter itself (e.g., the incoming line voltage) and take actions accordingly. For example, if the AC line voltage falls outside a range within a threshold number of line cycles, host device 260 can use energy stored in one or more capacitors 264 to sustain the operation of one or more components with the system (e.g., metrology unit 220 and/or a peripheral 230a-n) the system until all the critical information is saved in a non-volatile memory. The capacitors can be connected between initial voltage 331 and ground. Once all the critical information has been saved in the non-volatile memory, host device 260 can cease metering functions and can continue to monitor the AC line until the energy in the capacitors is depleted or the AC power outage is resolved.

Figure 6:
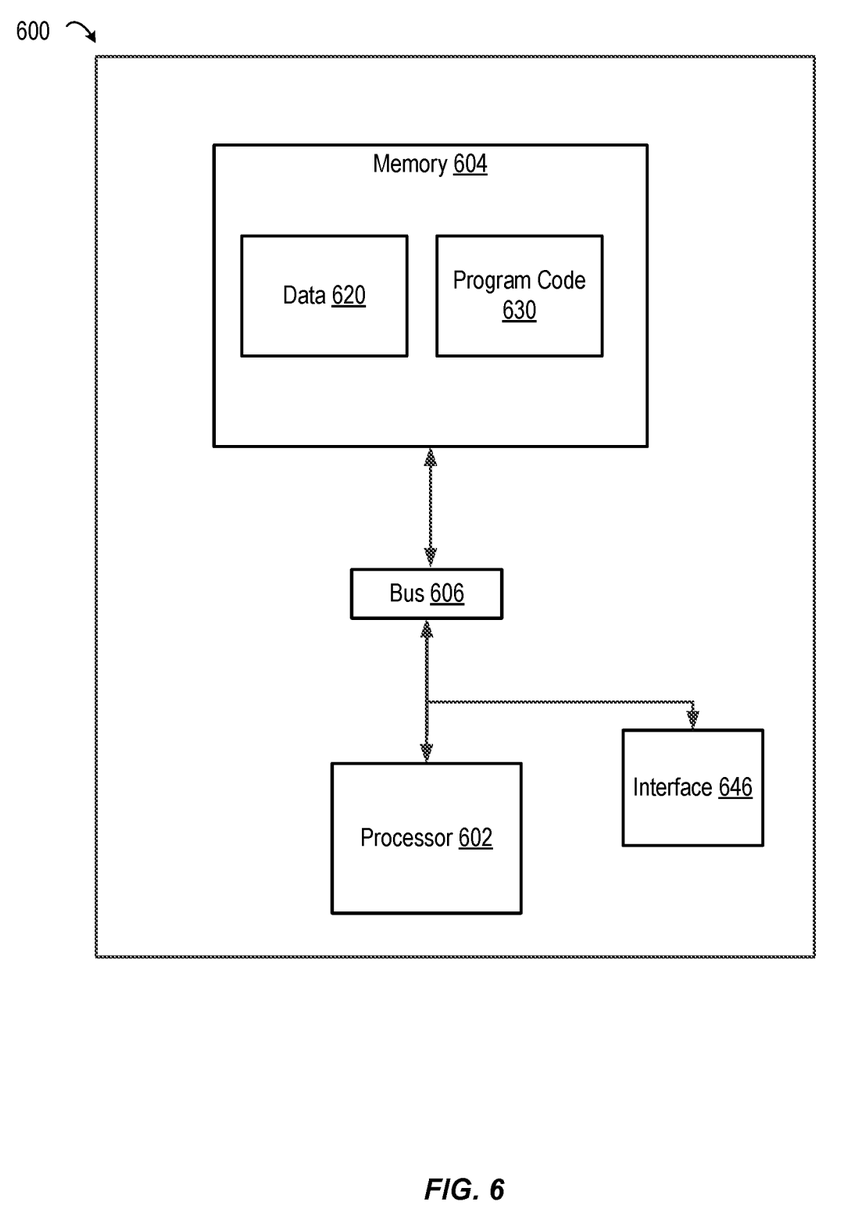
FIG. 6 illustrates an exemplary computing system for implementing meter host functionality, in accordance with an aspect of the present disclosure.

FIG. 6 illustrates an exemplary computing system for implementing meter host functionality, in accordance with an aspect of the present disclosure The depicted example of a computing device 600 includes a processor 602 (e.g., processor 265) communicatively coupled to one or more memory devices 604. The processor 602 executes computer-executable program code 630 (e.g., code that implements fault-tolerant power functions) stored in a memory device 604, accesses data 620 (e.g., metering data or fault data) stored in the memory device 604, or both. Examples of the processor 602 include a microprocessor, an application-specific integrated circuit ("ASIC"), a field-programmable gate array ("FPGA"), or any other suitable processing device. The processor 602 can include any number of processing devices or cores, including a single processing device. The functionality of the computing device may be implemented in hardware, software, firmware, or a combination thereof.

The memory device 604 includes any suitable non-transitory computer-readable medium for storing data, program code, or both. A computer-readable medium can include any electronic, optical, magnetic, or other storage device capable of providing a processor with computer-readable instructions or other program code. Non-limiting examples of a computer-readable medium include a flash memory, a ROM, a RAM, an ASIC, or any other medium from which a processing device can read instructions. The instructions may include processor-specific instructions generated by a compiler or an interpreter from code written in any suitable computer-programming language, including, for example, C, C++, C#, Visual Basic, Java, or scripting language. The computing device 600 executes program code 430 that configures the processor 602 to perform one or more of the operations described herein. For example, the program code 630 causes the processor to perform the operations described in FIG. 6.

The computing device 600 may also include a number of external or internal devices, such as input or output devices. For example, the computing device 600 is shown with interface 646. Interface 646 can receive input from input devices or provide output to output devices. One or more busses 606 are also included in the computing device 600. The bus 606 communicatively couples one or more components of a respective one of the computing device 600.

General Considerations

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method of operating a fault-tolerant power supply, the method comprising:
   converting an alternating-current (AC) voltage to an initial direct current (DC) voltage;
   converting the initial DC voltage to a first DC voltage and a second DC voltage;
   applying the first DC voltage to a metrology device;
   applying the second DC voltage to a peripheral device;
   when the initial DC voltage is outside a voltage range, deactivating the second DC voltage to the peripheral device; and
   maintaining the first DC voltage to the metrology device.

2. The method of claim 1, further comprising:
   receiving a temperature measurement; and
   when the temperature measurement is outside a temperature range, deactivating the second DC voltage to the peripheral device.

3. The method of claim 1, further comprising:
   when an amount of time has elapsed, reapplying the second DC voltage to the peripheral device.

4. The method of claim 3, further comprising:
   when the initial DC voltage has decreased outside the voltage range, disabling the second DC voltage and the peripheral device.

5. The method of claim 3, further comprising:
   when the initial DC voltage has decreased below the voltage range, disconnecting the peripheral device from the second DC voltage.

6. The method of claim 1, further comprising:
   monitoring the AC voltage; and
   when the AC voltage has decreased below an AC voltage range, applying power from a capacitor to the metrology device and saving metrology information to non-volatile memory.

7. The method of claim 6, wherein monitoring the AC voltage comprises determining whether the AC voltage is outside an AC voltage range.

8. The method of claim 1, further comprising:
   converting the initial DC voltage to a third DC voltage;
   applying the third DC voltage to an additional peripheral device;
   when the initial DC voltage is outside the voltage range, deactivating the third DC voltage to the additional peripheral device;
   when a first amount of time has lapsed, reapplying the second DC voltage to the peripheral device; and when the initial DC voltage is outside the voltage range, disabling the peripheral device and reapplying the third DC voltage to the additional peripheral device.

9. The method of claim 1, further comprising logging an error condition relating to the peripheral device.

10. A method of operating a fault-tolerant power supply, the method comprising:
   converting an alternating-current (AC) voltage to an initial direct current (DC) voltage;
   converting the initial DC voltage to a first DC voltage and a second DC voltage;
   applying the first DC voltage to a high-priority device;
   applying the second DC voltage to a low-priority device;
   when the initial DC voltage is outside a voltage range, deactivating the second DC voltage to the low-priority device; and
   maintaining the first DC voltage to the high-priority device.

11. The method of claim 10, wherein the second DC voltage is different from the first DC voltage.

12. The method of claim 10, further comprising:
   when an amount of time has elapsed, reapplying the second DC voltage to the low-priority device.

13. The method of claim 10, further comprising:
   when the initial DC voltage is outside the voltage range, disabling the second DC voltage and the low-priority device.

14. The method of claim 10, further comprising:
   monitoring the AC voltage; and
   when the AC voltage is outside an AC voltage range, applying power from a capacitor to the high-priority device and saving metrology information to non-volatile memory.

15. The method of claim 14, wherein monitoring the AC voltage comprises determining whether the AC voltage is outside an AC voltage range.

16. A electric meter comprising:
   a power supply configured to convert an alternating-current (AC) voltage to an initial direct current (DC) voltage;
   a DC to DC converter configured to convert the initial DC voltage to a first DC voltage and a second DC voltage; and
   a host processor configured to:
      cause the DC to DC converter to apply the first DC voltage to a metrology device;
      cause the DC to DC converter to apply the second DC voltage to a peripheral device; and
      when the initial DC voltage is outside a voltage range, cause the DC to DC converter to deactivate the second DC voltage to the peripheral device and maintain the first DC voltage to the metrology device.

17. The electric meter of claim 16, wherein the host processor is further configured to detect when an amount of time has elapsed and reapply the second DC voltage to the peripheral device.

18. The electric meter of claim 16, wherein the host processor is further configured to: when the initial DC voltage is outside the voltage range, disable the second DC voltage and the peripheral device.

19. The electric meter of claim 16, further comprising a temperature sensor, and wherein the host processor is further configured to:
   receive a temperature measurement from the temperature sensor; and
   when the temperature measurement is outside a temperature range, deactivate the second DC voltage to the peripheral device.

20. The electric meter of claim 16, wherein the host processor is further configured to:
   cause the DC to DC to convert the initial DC voltage to a third DC voltage;
   cause the DC to DC converter to apply the third DC voltage to an additional peripheral device;
   wait for a threshold amount of time; and
   reapply the second DC voltage to the peripheral device and reapply the third DC voltage to the additional peripheral device.

* * * * *